United States Patent [19]
Lott

[11] Patent Number: 5,315,156
[45] Date of Patent: May 24, 1994

[54] TRANSISTOR DEVICE LAYOUT
[75] Inventor: Joel M. Lott, Dublin, Pa.
[73] Assignee: SGS-Thomson Microelectronics, Inc., Carrollton, Tex.
[21] Appl. No.: 984,221
[22] Filed: Nov. 30, 1992
[51] Int. Cl.[5] ............ H01L 23/02; H01L 23/12; H01L 23/48; H01L 29/40
[52] U.S. Cl. .................. 257/728; 257/717; 257/724; 257/691; 257/584
[58] Field of Search ........... 257/691, 584, 561, 784, 257/921, 928, 664, 717, 724, 728

[56] References Cited
U.S. PATENT DOCUMENTS

| | | | |
|---|---|---|---|
| 3,860,879 | 1/1975 | McQuiddy, Jr. et al. | 330/4.9 |
| 3,886,505 | 5/1975 | Jacobson | 333/84 |
| 3,969,752 | 7/1976 | Martin et al. | 357/51 |
| 4,168,507 | 9/1979 | Yester, Jr. | 357/51 |
| 4,200,880 | 4/1980 | Frey | 357/51 |
| 4,891,686 | 1/1990 | Krausse, III | 357/68 |

Primary Examiner—Jerome Jackson
Assistant Examiner—T. M. Arroyo
Attorney, Agent, or Firm—Reneé M. Larson; Lisa K. Jorgenson; Richard K. Robinson

[57] ABSTRACT

A modified transistor layout allows operation at high frequencies without adversely effecting transistor power gain. The base and collector circuits are modified in order to minimize ground bar resistance and feedback problems between the input and output circuits. This reduces the applied negative feedback and maximizes gain. The collector contact bar and the output capacitor are mounted directly on the collector island such that the output capacitor is wired directly to the grounded package metal and the collector is wired to the collector contact bar. This eliminates the need to wirebond to areas on the collector island that are covered with the eutectic run-out which results from mounting the transistor chip on the collector island.

14 Claims, 1 Drawing Sheet

TRANSISTOR DEVICE LAYOUT

BACKGROUND OF THE INVENTION

1. Field of the Invention

The present invention relates generally to transistors, and more specifically to an improved radio frequency (RF)/Microwave bipolar junction transistor device layout.

2. Description of the Prior Art

The device layout of high frequency power transistor circuits can be critical to their performance. At RF and microwave frequencies, the parasitics internal and external to the device often become a problem. For example, bondwire inductance can introduce feedback between the input and output impedance matching circuits, which may be positive or negative depending on the amplifier configuration. This can be detrimental to gain and stability. As the operating frequency of the circuit increases, this problem is exacerbated.

Connection of the base lead to the transistor die has typically been accomplished by connecting bondwires from the base of the transistor to matching capacitor ground bars which form an integral part of both the input and the output matching circuit MOS capacitors. The ground bars are typically composed of a high conductivity material such as doped silicon, which results in a small but significant resistance from path to ground. The large current flowing in the output circuit generates a significant voltage drop across this resistance which is common to input and output circuits, which in turn contributes to negative feedback. This feedback voltage is subtracted from the input signal voltage at this point in the circuit; therefore, transistor power gain is limited.

In addition to the restraints placed upon the power gain by elements common to the input and output circuits, the layout of the collector circuit can adversely affect transistor performance. The collector connection is made to the backside of the transistor chip (the emitter and base connections are made to topside contacts). The transistor chip is mounted to an electrically isolated collector island that has a slightly larger dimension than the chip. The collector lead can then be connected to this "collector island" using a number of bondwires.

During the process of mounting the chip into its package, the island can become covered in silicon/gold eutectic to which a gold bondwire can not reliably bond. Aluminum wires, which often possess inferior bond pull strength when bonded to silicon/gold, must be used to bond the collector lead to the transistor die. As a practical matter, aluminum bondwires may also be undesirable if it is necessary to use a machine different from that used for gold bond wires since an extra wirebond step would be required during assembly.

SUMMARY OF THE INVENTION

A modified transistor layout allows operation at high frequencies without adversely effecting transistor power gain. The base and collector circuits are modified in order to minimize ground bar resistance and feedback problems between the input and output circuits. This reduces the applied negative feedback and maximizes gain. The collector contact bar and the output capacitor are mounted directly on the collector island such that the output capacitor is wired directly to the grounded package metal and the collector is wired to the collector contact bar. This eliminates the need to wirebond to areas on the collector island that are covered with the eutectic run-out which results from mounting the transistor chip on the collector island.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The present invention is directed to an improved transistor device layout for improved power gain characteristics in high frequency radio frequency (RF) and microwave circuits. The base and collector circuits of the device are different from the prior art in an attempt to provide reduced feedback between input and output MOS capacitor matching circuits, thereby providing increased power gain. The improved collector connection also eliminates the necessity to bond to silicon/gold eutectic.

Figure 1:
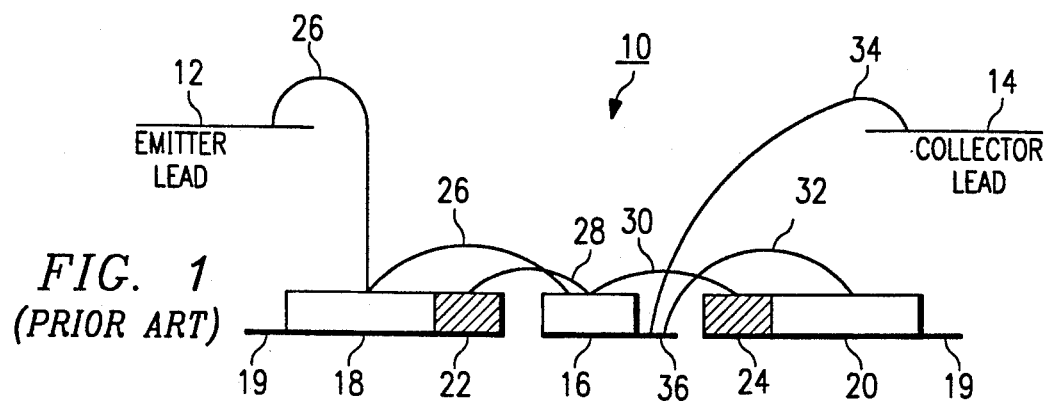
FIG. 1 is a transistor device layout according to the prior art.

FIG. 1 is a transistor layout according to the prior art. Transistor device layout 10 illustrates the connection to the emitter, collector and base of the transistor chip 16. Emitter lead 12 is connected to input MOS capacitor 18 and to transistor chip 16 by emitter bondwire 26. Input capacitor 18 and ground bar 22 are mounted on package metal 19, as are output capacitor 20 and ground bar 24. Output MOS capacitor 20 is connected to transistor chip 16 by means of shunt bondwire 32.

The base connection is made with two bondwires, 28 and 30. Base bondwires 28 and 30 are connected to the package ground through ground bars 22 and 24, respectively, which form an integral part of the input and output MOS capacitors. Ground bars 22 and 24 are composed of a high conductivity material, such as doped silicon. The resistance introduced by ground bars 22 and 24 is low, but significant because of the large currents flowing in this part of the circuit, which can generate a feedback voltage of significant amplitude compared to the input signals at this point in the circuit.

Collector lead 14 is connected to transistor chip 16 which is mounted on collector island 36 by collector bondwire 34. This collector connection introduces some problems. During mounting of the transistor chip into its package, it is common for collector island 36 to become covered in silicon/gold eutectic. Bondwire, such as gold or aluminum, can be made to adhere to the silicon/gold eutectic. However, the resultant bond is not reliable.

Figure 2:
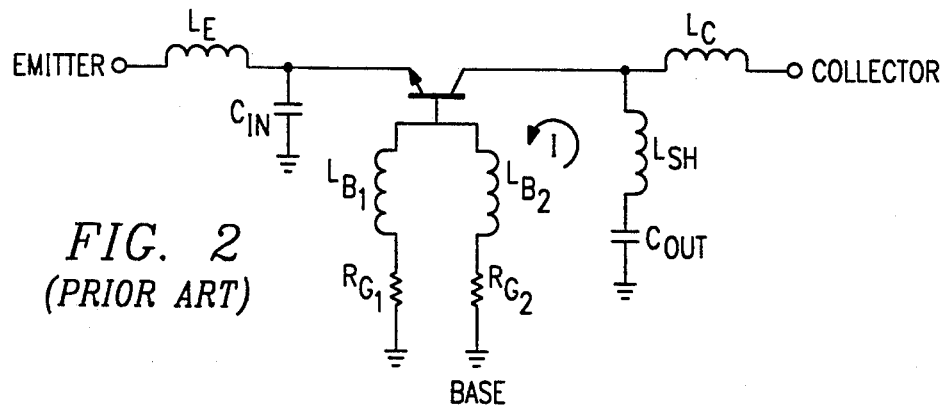
FIG. 2 is an equivalent circuit of the transistor device layout shown in FIG. 1 according to the prior art.

FIG. 2 is an equivalent circuit of the transistor device layout shown in FIG. 1. $L_E$, $L_t$, $L_{SH}$, $L_{B1}$, and $L_{B2}$ represent the inductances introduced by the emitter bondwire 26, the collector bondwire 34, the shunt bondwire 32, and the base bondwires 28 and 30, respectively. $C_{IN}$ and $C_{OUT}$ correspond to input MOS capacitor 18 and output MOS capacitor 20, respectively. Resistors $R_{G1}$ and $R_{G2}$ are representative of the resistances introduced by ground bar 22 and 24, respectively, which both go to ground potential. A large circulating current flows in the output circuit. Since ground bars 22 and 24 are in both the input and output circuits (i.e. they are common to both), the output circuit current flowing through them generates a negative feedback voltage on the signal being amplified, which is applied between emitter and base. This undesirable effect results in loss of power gain.

Figure 3:
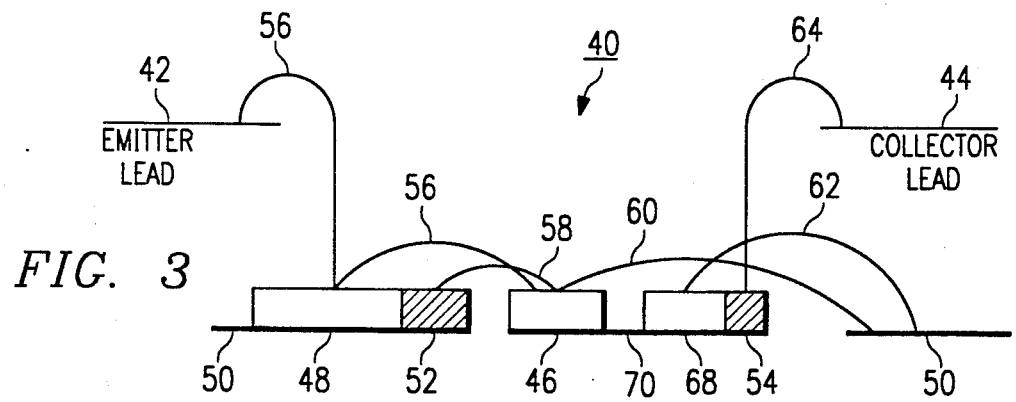
FIG. 3 is a transistor device layout according to the present invention.

FIG. 3 is a transistor device layout according to the present invention and addresses the problems associated with the layout shown in FIG. 1. The emitter connection is the same; emitter lead 42 is connected to input MOS capacitor 4 and transistor chip 46 by emitter bondwire 56. Input MOS capacitor 48 and ground bar 52 are mounted directly to package metal 50. However, the arrangement of the output matching circuit is different. The output MOS capacitor 68 is mounted directly on the collector island 70. Shunt bondwire 62 connects to output MOS capacitor 68 and the package metal 50, which is at ground potential.

The first base connection is made through base bondwire 58 and ground bar 52. However, the other base connection is made via bondwire 60 straight to the package metal. The connection to the collector lead 44 is made via collector bondwire 64 which connects to collector contact bar 54. Collector contact bar 54 is mounted directly on the collector island, 70. The collector contact bar 54 is gold metallized so that bondwires will easily adhere to it. As an example, gold bondwires may be used throughout the layout. However, in addition to gold, a number of different metallization schemes may be used. This feature eliminates the need to bond to silicon/gold eutectic; such a bond is unreliable.

Figure 4:
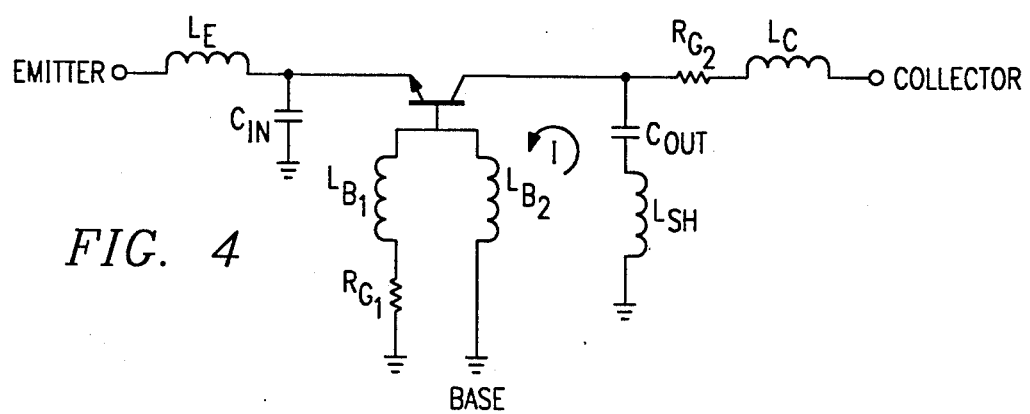
FIG. 4 is a equivalent circuit of the transistor device layout shown in FIG. 3 according to the present invention.

FIG. 4 is an equivalent circuit of the transistor device layout shown in FIG. 3. $L_E$, $L_t$, $L_{SH}$, $L_{B1}$, and $L_{B2}$ represent the inductances introduced by the emitter bondwire 56, the collector bondwire 64, the shunt bondwire 62, and the base bondwires 58 and 60, respectively. $C_{IN}$ and $C_{OUT}$ correspond to input MOS capacitor 48 and output MOS capacitor 68, respectively. I is the circulating current between the collector and the base.

In this equivalent circuit, $R_{G1}$ and $R_{G2}$ represent the resistance of ground bar 52 and collector contact bar 54. $R_{G2}$ is in series with the collector lead and is no longer in the base circuit. The resistance in the base circuit (common to input and output circuits) is reduced since inductance $L_{B2}$ is in parallel with the series combination of $L_{B1}$ and $R_{G1}$. This minimizes the negative feedback and the power gain is maximized. The resistance of $R_{G2}$ is small compared to the impedance at its location in the circuit so the loss incurred is minimal.

The invention described above is especially useful in several frequency ranges such as L Band, S Band, C Band and X band.

While the invention has been particularly shown and described with reference to two preferred embodiments, it will be understood by those skilled in the art that various changes in form and detail may be made therein without departing from the spirit and scope of the invention. For ease of explanation, a common-base transistor layout has been shown. However, one skilled in the art will recognize that the invention could also be implemented using a common-emitter transistor layout.

I claim:

1. A transistor layout for use in high frequency power gain circuits, comprising:
    a transistor chip having a base, emitter, and collector;
    a collector island connected to the collector of the transistor chip;
    an emitter lead and a collector lead;
    a collector contact bar mounted directly on the collector island;
    an input capacitor having an attached ground bar;
    a collector lead connected to the collector contact bar through a collector bondwire;
    a first base connection which connects the base of the transistor chip to the input capacitor ground bar through a first base bondwire and a second base connection which connects the base of the transistor chip directly to the metal of the transistor chip package; and
    an output capacitor which is mounted directly on the collector island.

2. The layout of claim 1, wherein the emitter lead is connected to the emitter by an emitter bondwire which connects the emitter lead to the input capacitor and the transistor chip.

3. The layout of claim 2, wherein the emitter bondwire is gold.

4. The layout of claim 3, wherein the input capacitor has an attached ground bar.

5. The layout of claim 4, wherein the first base bondwire is gold.

6. The layout of claim 4, wherein the second base bondwire is gold.

7. The layout of claim 1, wherein the input capacitor is MOS.

8. The layout of claim 7, wherein the output capacitor is connected to the metal of the transistor chip package through a shunt bondwire.

9. The layout of claim 8, wherein the collector contact bar is gold metallized.

10. The layout of claim 8, wherein the collector bondwire is gold.

11. The layout of claim 8, wherein the shunt bondwire is gold.

12. The layout of claim 8, wherein the package metal is at ground potential.

13. The layout of claim 1, wherein the output capacitor is MOS.

14. The layout of claim 8, wherein the output capacitor has an attached collector contact bar.

* * * * *